United States Patent
Sakai et al.

(10) Patent No.: US 9,307,639 B2
(45) Date of Patent: Apr. 5, 2016

(54) ELECTRO-DEPOSITED COPPER FOIL, SURFACE-TREATED COPPER FOIL USING THE ELECTRO-DEPOSITED COPPER FOIL AND COPPER CLAD LAMINATE USING THE SURFACE-TREATED COPPER FOIL, AND A METHOD FOR MANUFACTURING THE ELECTRO-DEPOSITED COPPER FOIL

(75) Inventors: Hisao Sakai, Saitama (JP); Masaru Takahashi, Saitama (JP); Mitsuyoshi Matsuda, Saitama (JP); Makoto Dobashi, Saitama (JP)

(73) Assignee: MITSUI MINING & SMELTING CO., LTD., Tokyo (JP)

( * ) Notice: Subject to any disclaimer, the term of this patent is extended or adjusted under 35 U.S.C. 154(b) by 2225 days.

(21) Appl. No.: 12/298,068

(22) PCT Filed: Apr. 26, 2007

(86) PCT No.: PCT/JP2007/059056
§ 371 (c)(1),
(2), (4) Date: Oct. 22, 2008

(87) PCT Pub. No.: WO2007/125994
PCT Pub. Date: Nov. 8, 2007

(65) Prior Publication Data
US 2009/0095515 A1    Apr. 16, 2009

(30) Foreign Application Priority Data

Apr. 28, 2006  (JP) ................................ 2006-126720
Sep. 19, 2006  (JP) ................................ 2006-252595

(51) Int. Cl.
*C25D 3/38*   (2006.01)
*H01K 1/00*   (2006.01)
(Continued)

(52) U.S. Cl.
CPC .. *H05K 1/09* (2013.01); *C25D 1/04* (2013.01); *C25D 3/38* (2013.01); *C25D 7/0614* (2013.01);
(Continued)

(58) Field of Classification Search
None
See application file for complete search history.

(56) References Cited

U.S. PATENT DOCUMENTS

| 5,431,803 A | 7/1995 | DiFranco et al. |
| 5,863,666 A | 1/1999 | Merchant et al. |

(Continued)

FOREIGN PATENT DOCUMENTS

| JP | 07-188969 | 7/1995 |
| JP | 10-330983 | 12/1998 |

(Continued)

OTHER PUBLICATIONS

English language Abstract JP 10-330983.
(Continued)

*Primary Examiner* — Monique Jackson
(74) *Attorney, Agent, or Firm* — Greenblum & Bernstein, P.L.C.

(57) ABSTRACT

Present invention provides an electro-deposited copper foil having the equivalent low-profile surface as in a conventional low-profile electro-deposited copper foil and extremely large mechanical strength and a method for manufacturing the same. The electro-deposited copper foil is formed by depositing fine copper crystal grains having a small deviation of grain-diameter. The electro-deposited copper foil has a low-profile and glossy surface and has extremely large mechanical strength expressed by a tensile strength as received of 70 kgf/mm² to 100 kgf/mm² and has a tensile strength after heating (180° C. for 60 minutes) corresponding to 85% or more of the tensile strength as received. The electro-deposited copper foil is manufactured by electrolysis using a sulfuric acid base copper electrolytic solution containing a compound composed of a benzene ring having a sulfo group bonded thereto, a sulfonate of an active sulfur compound and a polymer of a quaternary ammonium salt having a cyclic structure.

29 Claims, 1 Drawing Sheet

(51) Int. Cl.
*H05K 1/09* (2006.01)
*C25D 1/04* (2006.01)
*C25D 7/06* (2006.01)
*H05K 1/03* (2006.01)
*H05K 3/40* (2006.01)

(52) U.S. Cl.
CPC ............ *H05K 1/0393* (2013.01); *H05K 3/4092* (2013.01); *H05K 2201/0355* (2013.01); *H05K 2201/0397* (2013.01); *Y10T 428/12438* (2015.01)

(56) References Cited

U.S. PATENT DOCUMENTS

| | | | |
|---|---|---|---|
| 5,958,209 A * | 9/1999 | Sakai et al. | 205/585 |
| 6,194,056 B1 | 2/2001 | Sakai et al. | |
| 6,231,742 B1 | 5/2001 | Sano et al. | |
| 6,652,725 B2 | 11/2003 | Taniguchi et al. | |
| 7,789,976 B2 * | 9/2010 | Sano et al. | 148/411 |
| 2004/0163842 A1 * | 8/2004 | Okada et al. | 174/254 |
| 2006/0166032 A1 | 7/2006 | Kumagai et al. | |
| 2006/0191798 A1 | 8/2006 | Sano et al. | |
| 2006/0210823 A1 | 9/2006 | Sano et al. | |

FOREIGN PATENT DOCUMENTS

| | | |
|---|---|---|
| JP | 11-501268 | 2/1999 |
| JP | 2001-123289 | 5/2001 |
| JP | 2001-329390 | 11/2001 |
| JP | 2004-263289 | 9/2004 |
| JP | 2004-339558 | 12/2004 |
| JP | 2006-152420 | 6/2006 |
| WO | 97/43466 | 11/1997 |
| WO | 2004/055246 | 7/2004 |
| WO | WO 2004101859 A1 * | 11/2004 |

OTHER PUBLICATIONS

English language Abstract JP 2001-329390.
English language Abstract JP 2004-339558.
English language Abstract JP 07-188969.
English language Abstract JP11-501268.
English language Abstract JP 2006-152420.
English language Abstract JP 2001-123289.
U.S. Appl. No. 11/910,050, filed Sep. 28, 2007.
U.S. Appl. No. 12/089,671, filed Apr. 9, 2008.
English language Abstract JP 2004-263289.

* cited by examiner

ELECTRO-DEPOSITED COPPER FOIL, SURFACE-TREATED COPPER FOIL USING THE ELECTRO-DEPOSITED COPPER FOIL AND COPPER CLAD LAMINATE USING THE SURFACE-TREATED COPPER FOIL, AND A METHOD FOR MANUFACTURING THE ELECTRO-DEPOSITED COPPER FOIL

TECHNICAL FIELD

The present invention relates to an electro-deposited copper foil, a surface-treated copper foil using the electro-deposited copper foil and a copper clad laminate using the surface-treated copper foil, and also relates to a method for manufacturing the electro-deposited copper foil. In particular, the present invention relates to an electro-deposited copper foil having a low-profile deposit surface and large mechanical strength, and a method for manufacturing the same.

BACKGROUND ART

In accordance with requirement on so-called down-sizing to reduce in size and weight of electronic and electric apparatuses, same kind of performance is required on the printed wiring boards also. For the printed wiring boards, formation of a miniaturized and high functional wiring is required in a limited mounting area. Thus, a fine-pitch wiring must be formed to prepare a high density wiring. To obtain such a fine-pitch wiring, a thinner copper foil having the lower surface roughness on the bonding side to a base material has been employed to reduce over-etching time.

For this purpose, a low-profile electro-deposited copper foil is generally used. Also, to ease handling of the copper foil and a copper clad laminate when the copper foil thickness is reduced, efforts have been made to increase mechanical strength of the copper foil. Such a low-profile electro-deposited copper foil having excellent mechanical strength is disclosed in Patent Documents 1 and 2, which will be more specifically described below.

Object of Patent Document 1 is to provide a low-profile electro-deposited copper foil, which has a low-profile surface suitable for practical use in a printed wiring board and a negative-electrode collector of a lithium ion secondary battery as well as excellent fatigue ductility. More specifically, object of the document is to provide a low-profile electro-deposited copper foil having a surface roughness (Rz) of 2.0 μm or less, which has a low-profile surface without wavy undulation and having an elongation of 10.0% or more at 180° C. For this purpose, Patent Document 1 discloses a method of manufacturing an electro-deposited copper foil by using an aqueous sulfuric acid/copper sulfate solution as an electrolytic solution, an insoluble anode made of a titanium plate coated with a platinum metal or an oxide thereof and a cathode drum (which faces to the anode) made of a titanium and supplying direct current between the electrodes. In this manufacturing method, the electrolytic solution contains an oxyethylene surfactant, polyethylene imine or a derivative thereof, a sulfonic acid salt of an active organic sulfur compound and chloride ions. By the presence of these compounds, a low-profile electro-deposited copper foil (which has a low-profile surface with uniform roughness and having a surface roughness (Rz) of 2.0 μm or less without wavy undulation and having an elongation of 10.0% or more at 180° C.) can be obtained. Examples of Patent Document 1 discloses that the electro-deposited copper foil obtained had a deposit surface having a surface roughness (Rz) of 0.9 μm to 2.0 μm, an elongation as received of 10% to 18%, an elongation at 180° C. of 10% to 20%, a tensile strength as received of 340 MPa to 500 MPa, and a tensile strength at 180° C. of 180 MPa to 280 MPa. The document also discloses that the deposit surface of the electro-deposited copper foil had a gloss [Gs(85°)] of 120 to 132, which was measured at an angle of 85° for the transverse direction.

Patent Document 2 discloses the technologies which object to provide a low-profile electro-deposited copper foil having a low-profile surface and less tensile strength loss after heating, and having an excellent elongation at high temperature, and object to provide a method for manufacturing the same also. For this purpose, five additives, namely, hydroxyethylcellulose, polyethylene imine, acetylenic glycol, a sulfonic acid salt of an active organic sulfur compound and chloride ions are added in an electrolytic solution, which is an aqueous sulfuric acid/copper sulfate solution. By the presence of these five additives, it enables to obtain a low-profile electro-deposited copper foil having a surface roughness (Rz) of 2.5 μm or less, a tensile strength (at 25° C. measured within 20 minutes after finishing electro-deposition) of 500 MPa or more, a reduction rate of the tensile strength (at 25° C. measured at 300 minutes after finishing electro-deposition) of 10% or less or a tensile strength loss (at 25° C. measured after a foil is heated at 100° C. for 10 minutes after finishing electro-deposition) of 10% or less, and an elongation at 180° C. of 6% or more.

Examples of Patent Document 2 disclose that an electrolytic solution, which consists of an aqueous sulfuric acid/copper sulfate solution containing 100 g/L sulfuric acid ($H_2SO_4$) and 280 g/L copper sulfate 5 hydrates ($CuSO_4 5H_2O$), was used as a basic solution;

additives, hydroxyethylcellulose, polyethylene imine, sodium 3-mercapto-1-propanesulfonic acid, acetylenic glycol and hydrochloric acid were added to the basic solution;

the electrolytic solution was filled in the gap between an insoluble anode made of platinum oxide coated titanium and a cathode drum made of titanium;

electrolysis was performed at a current density of 40 $A/dm^2$ and a temperature of the electrolytic solution of 40° C. to obtain an electro-deposited copper foil of 18 μm in thickness; and the electro-deposited copper foil thus obtained had a deposit surface having a surface roughness (Rz) of 1.5 μm to 2.3 μm, a tensile strength as received of 650 MPa to 900 MPa and a tensile strength loss (measured after heated at 100° C. for 10 minutes) of 0% to 7.7%.

As described above, according to each of the Examples of these documents, the electro-deposited copper foils manufactured by these methods have low-profile deposit surfaces. The quality level thereof is excellent as a conventional low-profile electro-deposited copper foil and may be effective for forming a fine-pitch wiring. It is also disclosed that more excellent mechanical strength than that of a conventional electro-deposited copper foil can be obtained. It should be noted that the term "low-profile" used in a copper foil for a printed wiring board means that the height between peak and valley of a bonding side of a copper foil to be bonded to an insulating layer-forming material is low.

[Patent Document 1] Japanese Patent Laid-Open No. 2004-263289

[Patent Document 2] Japanese Patent Laid-Open No. 2004-339558

DISCLOSURE OF THE INVENTION

As described above, there are various types of electro-deposited copper foils for a printed wiring board having different qualities. In particular, in a tape automated bonding (TAB) substrate for use in direct mounting of a device such as IC chips, a fine-pitch wiring far beyond the level of a rigid printed wiring board is formed. For the reason, a low-profile electro-deposited copper foil is significantly required. However, the TAB substrate has a flying lead 1, as schematically shown in FIG. 1. A device is directly mounted on this portion. Therefore, when the electro-deposited copper foil having low mechanical strength is used, pressure applied during a bonding step results the defect, elongation of the flying lead 1. Note that FIG. 1 is a schematic sectional view of TAB substrate including a device-hole portion which is formed of, other than the flying lead 1, a wiring 2 formed of copper foil, an adhesive 3, a base film (polyimide film)$_4$, a solder resist 5, a rear-side solder resist 6, device (IC chip)$_7$, an IC mounting portion (device hole)$_8$, a work table for gang-bonding 9, a first terminal portion 10 to be connected with a liquid crystal display panel, etc., a second terminal portion 11 to be connected with a printed wiring board and folding portion 12.

However, because of judgment that increase of mechanical strength of the electro-deposited copper foil is limited, tendency to adopt a COF (chip on film) substrate having no flying lead (schematically illustrated in FIG. 2) in place of the TAB substrate has been accelerated. When a method of mounting a device on the COF substrate is mainly employed, a bonding machine for a TAB substrate that manufactures facilitated may not be used effectively. This may be a loss of social capital. To overcome the problem, an electro-deposited copper foil having the mechanical strength equivalent to that of the phosphor bronze, more specifically, a tensile strength of exceeding 70 kgf/mm$^2$, which permits formation of a fine-pitch wiring on a TAB substrate, has been required. Note that FIG. 2 schematically shows a sectional view of a COF substrate formed of, other than a bonding lead 1, a wiring 2' formed of copper foil, a base film (polyimide film) 4', a solder resist 5', a device (IC chip) 7', an IC mounting portion 8', a first terminal portion 10' to be connected with a liquid crystal display panel, etc., a second terminal portion 11' to be connected with a printed wiring board and a folding portion 12'.

In Patent Document 2, an electro-deposited copper foil which performs a tensile strength exceeding 70 kgf/mm$^2$ is disclosed. However, a tensile strength equivalent to the level shown in Patent Document 2 was not obtained in Comparative Examples which is the trace experiments performed by inventors as shown later. The value of tensile strength was up to about 58 kgf/mm$^2$. Therefore, it may be difficult to stably produce an electro-deposited copper foil having the mechanical strength equivalent to that of the phosphor bronze, more specifically, having a tensile strength exceeding 70 kgf/mm$^2$.

As is described above, in the field of printed wiring boards, it has been required to develop an electro-deposited copper foil having a low-profile surface and extremely large mechanical strength that has never been obtained in the art, and a method for stably manufacturing the foil.

In the circumstances, the present inventors conducted intensive studies. As a result, they have thought out an electro-deposited copper foil having a glossy deposit surface as well as low-profile, extremely large mechanical strength and little time-dependent change of mechanical properties by depositing copper to have fine crystal grains with small deviation, and also thought out a method for manufacturing the same.

Re: An Electro-Deposited Copper Foil According to the Present Invention

An electro-deposited copper foil according to the present invention which is obtained by electrolysis of a copper electrolytic solution is characterized in that a tensile strength as received is 70 kgf/mm$^2$ to 100 kgf/mm$^2$.

In an electro-deposited copper foil according to the present invention, it is preferable that a tensile strength measured after heating at 180° C. for 60 minutes is 85% or more of the tensile strength as received.

Furthermore, in an electro-deposited copper foil according to the present invention, it is preferable that a tensile strength as received measured at 30 days after manufacturing is not less than 65 kgf/mm$^2$.

Furthermore, in an electro-deposited copper foil according to the present invention, it is preferable that an elongation as received is 3% to 15%.

Furthermore, in an electro-deposited copper foil according to the present invention, it is preferable that an elongation measured after heating at 180° C. for 60 minutes is lower than the elongation as received.

Furthermore, in an electro-deposited copper foil according to the present invention, it is preferable that a gloss [Gs(60°)], which is measured at an incident/reflection angle of 600 for the transverse direction of a deposit surface, is 80 or more.

Re: Surface-Treated Electro-Deposited Copper Foil According to the Present Invention A surface-treated electro-deposited copper foil according to the present invention is characterized in that a surface of the electro-deposited copper foil is treated with one, two or more types of treatments selected from a roughening treatment, a rust-proofing treatment and a silane coupling agent treatment.

Re: Method for Manufacturing an Electro-Deposited Copper Foil According to the Present Invention A method for manufacturing an electro-deposited copper foil according to the present invention is a method for manufacturing an electro-deposited copper foil by electrolysis using a sulfuric acid base copper electrolytic solution, characterized in that the sulfuric acid base copper electrolytic solution contains the following additives A to C:

Additive A: a compound composed of a benzene ring and a heterocyclic ring which contains a nitrogen atom (N) and a bonded mercapto-functional group, or a thiourea-functional compound;

Additive B: a sulfonate of an active sulfur compound;

Additive C: a polymer of a quaternary ammonium salt having a cyclic structure.

In the method for manufacturing an electro-deposited copper foil according to the present invention, it is preferable that the additive A is one, two or more types of compounds selected from an imidazole-functional compound, a thiazole-functional compound, a tetrazole-functional compound and a thiourea-functional compound with an alkane group having 2 or more carbon atoms bonded at both ends.

In the method for manufacturing an electro-deposited copper foil according to the present invention, it is more preferable that the benzene ring of the additive A has a sulfo group bonded thereto.

It is preferable that the additive A is one, two or more types of compounds selected from 2-mercapto-5-benzimidazole sulfonic acid, 3(5-mercapto-1H-tetrazolyl)benzene sulfonate, 2-mercaptobenzothiazole or N—N diethylthiourea.

It is preferable that the total concentration of the additive A in the sulfuric acid base copper electrolytic solution is 1 ppm to 50 ppm.

In a method for producing an electro-deposited copper foil according to the present invention, it is preferable that the additive B is 3-mercapto-1-propanesulfonic acid, bis(3-sulfopropyl)disulfide or a mixture thereof.

It is preferable that the concentration of the additive B in the sulfuric acid base copper electrolytic solution is 1 ppm to 80 ppm.

In a method for producing an electro-deposited copper foil according to the present invention, it is preferable that the additive C is a diallyldimethylammonium chloride polymer.

It is preferable that the concentration of the additive C in the sulfuric acid base copper electrolytic solution is 0.5 ppm to 100 ppm.

Furthermore, it is preferable that the ratio of the concentration of the additive B to the concentration of the additive C in the sulfuric acid base copper electrolytic solution, that is, a value of [(B concentration)/(C concentration)], is 0.07 to 1.4.

In a method for producing an electro-deposited copper foil according to the present invention, it is preferable that the concentration of chlorine in the sulfuric acid base copper electrolytic solution is 5 ppm to 100 ppm.

Re: Copper Clad Laminate According to the Present Invention

A copper clad laminate according to the present invention is obtained by bonding the surface-treated electro-deposited copper foil and an insulating layer-forming material. When the insulating layer-forming material constituting the copper clad laminate according to the present invention contains a reinforcement, a rigid copper clad laminate is obtained. On the other hand, when the insulating layer-forming material constituting the copper clad laminate according to the present invention is a flexible material having flexibility, a flexible copper clad laminate is obtained.

Re: Printed Wiring Board According to the Present Invention

A printed wiring board according to the present invention is obtained by applying an etching process for forming wiring to the copper clad laminate formed of a surface-treated electro-deposited copper foil according to the present invention. When a rigid copper clad laminate as mentioned above is used, a rigid printed wiring board is obtained. When a flexible copper clad laminate as mentioned above is used, a flexible printed wiring board is obtained An electro-deposited copper foil according to the present invention is characterized in that copper crystal grains deposited are fine and deviation of particle diameters thereof is small that has never been obtained in the art. As a result, the electro-deposited copper foil of the present invention has a glossy deposit surface as well as low-profile level equivalent to that of a conventional low-profile electro-deposited copper foil, and has extremely large mechanical strength. The mechanical strength is not greatly reduced after heating and long-term storage after manufacturing. Accordingly, a surface-treated electro-deposited copper foil made of the electro-deposited copper foil may have the equivalent large mechanical strength and low-profile surface as those of the conventional low-profile electro-deposited copper foil. When the surface-treated electro-deposited copper foil of the present invention is used in place for a conventional printed wiring board in which copper foil thickness cannot be reduced since the strength of the substrate is the first priority, reduction of the copper foil thickness can be achieved. As a result, both of formation of a fine-pitch wiring and reduction of a substrate weight can be achieved.

The electro-deposited copper foil and a method for manufacturing a surface-treated copper foil are characterized by the composition of the copper electrolytic solution to be used. Therefore, conventional equipment can be used, i.e., additional equipment is not required. In addition, there is no reduction of productivity. Moreover, the copper electrolytic solution is excellent in stability and can be used continuously for a long time. The copper electrolytic solution is thus economically favorable.

Furthermore, extremely large mechanical strength of the electro-deposited copper foil makes the handling of a copper clad laminate made of the surface-treated electro-deposited copper foil easy because warp and distortion are reduced even if it is thin. In particular, when a flexible copper clad laminate is formed by bonding the electro-deposited copper foil to a film of an insulating layer-forming material and used as a TAB substrate, which is strongly required for use in formation of a fine-pitch wiring, it enables to produce a TAB substrate having a fine-line flying lead that has never been performed in the art, owing to the extremely large mechanical strength of the electro-deposited copper foil.

DESCRIPTION OF SYMBOLS

Figure 1:
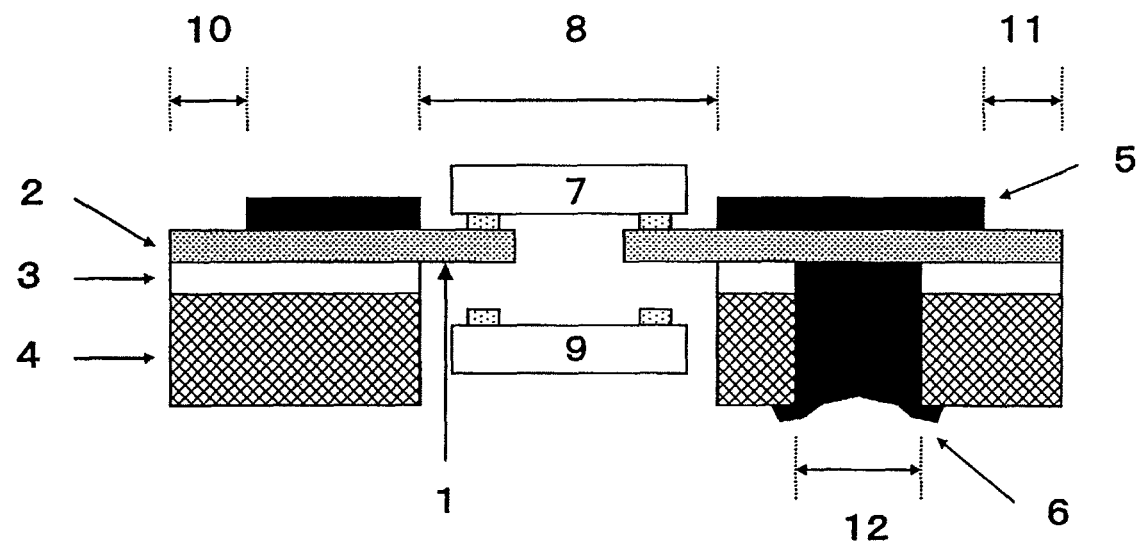
FIG. 1 shows a schematic view illustrating one example of a TAB substrate having a flying lead on which a driving device (IC) for an LCD panel is mounted.
Figure 2:
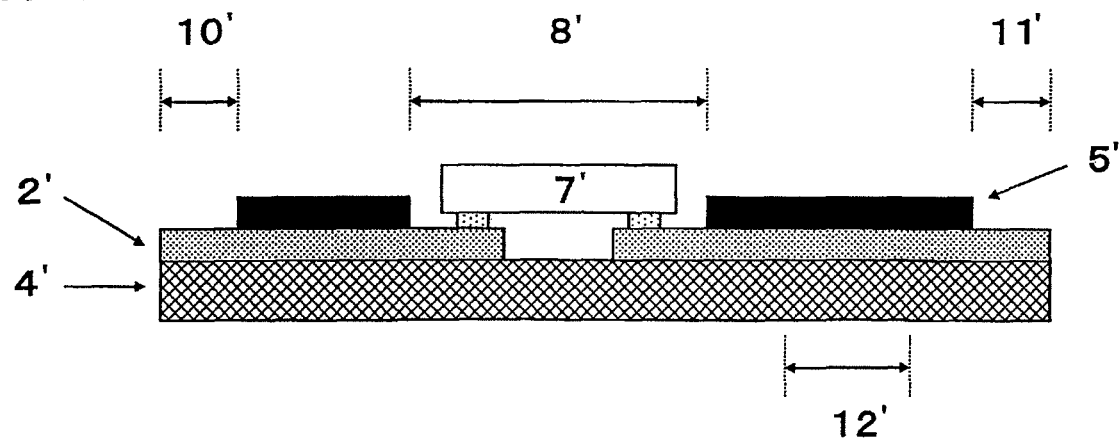
FIG. 2 is a schematic view illustrating one example of a COF substrate fully supported by film on which a driving device (IC) for an LCD panel is mounted.

1 Flying lead
2, 2' Wiring formed of copper foil
3 Adhesive
4, 4' Base film (polyimide film)
5, 5' Solder resist
6 Rear-side solder resist
7, 7' Device (IC chip)
8, 8' IC mounting portion (also referred to as a device hole in FIG. 1)
9 Work table for gang-bonding
10, 10' First terminal portion (to be connected with a liquid crystal display panel)
11, 11' Second terminal portion (to be connected with a printed wiring board)
12, 12' Folding portion

BEST MODE FOR CARRYING OUT THE INVENTION

Re: Embodiment of Electro-Deposited Copper Foil According to the Present Invention An electro-deposited copper foil according to the present invention will be described below. At first, a general method for manufacturing an electro-deposited copper foil will be described to ease understanding of the description. The term "electro-deposited copper foil" according to the present invention refers to an electro-deposited copper foil having no treatment applied to the surface thereof. Therefore, it is sometimes called as an "untreated copper foil" or a "drum foil"; however, it will be simply referred to as "electro-deposited copper foil" in this specification. In manufacturing an electro-deposited copper foil, a continuous production process is generally employed. A sulfuric acid base copper electrolytic solution is supplied into the gap between a rotating drum cathode and a lead-based anode or a dimension stable anode (DSA), which is arranged along with the shape of the rotating cathode and facing to the cathode. Then, an electrolytic reaction is performed to deposit copper on the surface of the rotating cathode. The deposited copper in the form of thin film is continuously peeled off from the rotating cathode and wound up.

Since the surface of the electro-deposited copper foil that has been in contact with the rotating cathode and then peeled off therefrom has a mirror shape of a polished surface profile of the rotating cathode and the surface is shiny, so the surface is referred to as "shiny surface". In contrast, since the growth rates of depositing copper grains vary depending upon the crystal plane, the surface on a deposit side of the electro-deposited copper foil is generally rough (having mount-form projections) and the surface is usually referred to as a "matte surface". However, the surface of the deposit side obtained in the present invention is smooth. Therefore, surface of the deposit side of the copper foil of the present invention will be referred to as a "deposit surface" in this specification.

To the electro-deposited copper foil thus obtained, a surface treatment such as a roughening treatment in order to enhance adhesion to an insulating layer-forming material by anchor effect and a rust-proofing treatment for preventing oxidation are subjected to finish a commercially available surface-treated electro-deposited copper foil. However, the electro-deposited copper foil is sometimes used without a roughening treatment in accordance with the requirement of the application.

An electro-deposited copper foil according to the present invention has a tensile strength as received of 70 kgf/mm$^2$ to 100 kgf/mm$^2$, which is extremely large mechanical strength that has never been achieved in the conventional electro-deposited copper foil. The tensile strength as received is a mechanical property which is obtained by a tensile test in a constant pulling rate performed at room temperature where the load is continuously measured until the foil rupture. Then, the tensile strength is calculated from the maximum load obtained in the measurement. The tensile strength above is performed on an electro-deposited copper foil just peeled off from the rotating cathode without any treatment. In the measurement thus performed, an elongation as received is obtained at the same time. In the case of a conventional electro-deposited copper foil, the tensile strength as received is usually 60 kgf/mm$^2$ or less (generally, falls within the range of 30 kgf/mm$^2$ to 45 kgf/mm$^2$). It means that the products performing a tensile strength as received exceeding 70 kgf/mm$^2$ have not yet been present. Accordingly, the tensile strength as received of 70 kgf/mm$^2$ to 100 kgf/mm$^2$ in an electro-deposited copper foil according to the present invention is equal to or more than that of an extra hard phosphor bronze (grade: EH). In addition, even if the copper foil is heated, a reduction rate of tensile strength is low, as described later. This is also characteristic point.

An electro-deposited copper foil according to the present invention has extremely fine and uniform crystal grains. Since the crystal grains are very fine, the deposit surface should be a flat and glossy surface. In addition, as grain boundary is preferentially dissolved in the etching process, reduced crystal grain size can improve side etching property. As a result, the obtained wiring is improved in linearity.

Furthermore, the mechanism of the rupture in a metal foil in a folding endurance test or a tensile test will be considered. Rupture may occur as follows. First, a micro-crack generates at the edge portion of a test specimen or wirings during the test. Folding endurance stress or tensile stress is intensively applied to the micro-crack. As a result, the micro-crack linearly grows to cause rupture. In such phenomenon, the crack mainly grows along the grain boundary. When the crystal grains are fine, the length of the grain boundary along which a crack grows might be long. It means that resistance against growth of the crack, in other words, resistance against rupture increases. As a result, the tensile strength exceeds 70 kgf/mm$^2$. According to a more preferable embodiment, a tensile strength exceeding 80 kgf/mm$^2$ can be obtained.

As a copper foil performing a large tensile strength as received, a rolled copper foil is known to which a high reduction processing is applied. However, when the rolled copper foil is heated, an effect of annealing is easily performed to reduce mechanical strength. Conversely, in the case of an electro-deposited copper foil according to the present invention, the reduction rate of the tensile strength after heating is low. More specifically, in an electro-deposited copper foil according to the present invention, a tensile strength after heating (after heating at 180° C. for 60 minutes) maintains 85% or more of the tensile strength as received, and more preferably, 90% or more. The tensile strength after heating is the tensile strength measured after heating an electro-deposited copper foil according to the present invention at 180° C. for 60 minutes in the ambient atmosphere followed by cooling down to room temperature. In the case of a conventional electro-deposited copper foil, the tensile strength after heating (180° C. for 60 minutes) of the foil is usually 60% or less of the tensile strength as received. The reason why such low reduction rate of the tensile strength can be performed is expected that the additives which are included during electrolysis are uniformly distributed in the grain boundary because the electro-deposited copper foil according to the present invention has very fine crystal grain sizes together with the small deviation. The additives perform as a diffusion barrier to prevent growth of crystal grains of metal copper during a heating process. Therefore, the small size of the crystal grains can be effectively maintained after heating. Note that, the reason why the condition of 180° C.×60 minutes is employed as a heating condition in the present invention is to set the heating condition close to the hot pressing condition, which is most frequently used in manufacturing a copper clad laminate.

An electro-deposited copper foil according to the present invention preferably has a tensile strength as received of 65 kgf/mm$^2$ or more measured at 30 days after manufacturing. Generally, at least 3 months is required for a quality assurance period of an electro-deposited copper foil. So, it is preferred to assure the tensile strength as received with the value measured at 3 months after manufacturing. However, change of the mechanical properties of an electro-deposited copper foil has tendency to proceed with the time passing which begins just after manufacturing even if it is stored at room temperature and saturate at 30 days after manufacturing. Thereafter, no significant change of the mechanical properties is observed as long as the electro-deposited copper foil is stored at room temperature. Then, the tensile strength as received of an electro-deposited copper foil according to the present invention can be assured with the value measured at 30 days after manufacturing. In this specification, the upper limit of tensile strength as received measured at 30 days after manufacturing is not defined. However, the finer the crystal grains, the lower the change with the time passing. Therefore, the upper limit is conceivably the equivalent as tensile strength as received, that is, 100 kgf/mm$^2$.

An electro-deposited copper foil according to the present invention has an elongation as received of 3% to 15%. An elongation as received of 3% or more is preferred to prevent foil clacking in processing of the copper clad laminate by a mechanical drill to form a through-hole in a substrate. The upper limit of the elongation as received of an electro-deposited copper foil according to the present invention is empirically defined as about 15% since crystal grains are fine. However, in consideration of processability by the mechanical drill, the elongation as received is preferably 10% or less.

An electro-deposited copper foil according to the present invention is also characterized in that the elongation after heating (180° C. for 60 minutes) is lower than the elongation as received. The elongation after heating is the elongation measured after heating an electro-deposited copper foil according to the present invention at 180° C. for 60 minutes in the ambient atmosphere followed by cooling down to room temperature. Most of the conventional electro-deposited copper foils perform an effect of annealing when heated. Of them, a low temperature annealable electro-deposited copper foil excellent in effect of annealing performs reduction of an elongation when it is heated at 180° C. for about 5 to 15 minutes; however, a reduction rate is less than about 5%. When heating is performed at 180° C. for 60 minutes, the elongation after heating tends to be larger than the elongation as received. In contrast, in an electro-deposited copper foil according to the present invention, the elongation after heating at 180° C. for 60 minutes is lower than the elongation as received. Thus, behavior of the elongation after heating differs from that of conventional electro-deposited copper foils.

To describe more specifically, the elongation after heating of an electro-deposited copper foil according to the present invention is reduced at a rate within the range of 5 to 50% relative to 100% of the elongation as received. The phenomenon where a tensile strength and an elongation are reduced by heating can be regarded as the similar phenomenon called quenching in the field of rolled copper. Therefore, when heating is further continued, the tensile strength after heating continuously be reduced; however, the elongation after heating is reduced and makes a turn to gain at a some point.

In a method for manufacturing the aforementioned electro-deposited copper foil, obtaining fine and uniform crystal grains is effective to smooth projections and depressions in the deposit surface. When a gloss is adapted to the indicator of the smoothness of the deposit surface of an electro-deposited copper foil according to the present invention, smoothness of the deposit surface is represented by a gloss [Gs(60°)] of 80 or more. When a gloss [Gs(60°)] of 80 or more is achieved by the manufacturing method described later, an electro-deposited copper foil according to the present invention performs mechanical properties: a tensile strength as received of 70 kgf/mm$^2$ to 100 kgf/mm$^2$ and a tensile strength after heating (180° C. for 60 minutes) of 85% or more of the tensile strength as received, and more preferably, 90% or more.

Re: Surface Treated Electro-Deposited Copper Foil According to the Present Invention The surface-treated electro-deposited copper foil according to the present invention is obtained by applying one, two or more treatments selected from a roughening treatment, a rust-proofing treatment and a silane coupling agent treatment, to the surface of the electro-deposited copper foil. The surface treatment to be applied to obtain a surface-treated electro-deposited copper foil according to the present invention should be performed in accordance with the requirements, adhesion, chemical resistance, heat resistance and the like of the applications and a roughening treatment, a rust-proofing treatment, a silane coupling agent treatment and the like may be applied to the surface, respectively.

The term "roughening treatment" used herein refers to a treatment for physically improving adhesion of the copper foil to an insulating layer-forming material. The roughening treatment is generally applied to the deposit surface. More specifically, a rough surface is formed either by the method attaching fine metal particles onto a surface of an electro-deposited copper foil or by an etching method. Generally, the former method, that is, a roughening method of attaching fine metal particles is employed. This roughening method usually comprises the steps of a burning plating step for depositing and attaching fine copper particles on the deposit surface of an electro-deposited copper foil and a seal plating step for preventing being put away of the fine copper particles.

Next, the rust-proofing treatment will be described. The rust-proofing treatment for providing a cover layer is performed to prevent oxidation and/or corrosion of the surface of a surface-treated electro-deposited copper foil during the manufacturing processes for a copper clad laminate and/or a printed wiring board. For rust-proofing, either a rust-proofing treatment with an organic compound such as benzotriazole or imidazole, or a rust-proofing treatment with an inorganic compound such as zinc, chromate or a zinc alloy may be used without problems. A rust-proofing method that is considered to be the most suitable for the application may be selected. When an organic rust-proofing agent is selected, a rust-proofing layer may be formed of the organic rust-proofing agent by a dip-coating method, a showering coating method, an electro-deposition method or the like. When an inorganic rust-proofing agent is selected, a rust-proof layer is formed of the inorganic rust-proofing agent by an electrolytic method, an electro-less plating method, a sputtering method, a substitution precipitation method or the like. In such a manner, rust-proofing element can be deposited onto the surface of an electro-deposited copper foil.

The silane coupling agent treatment is performed for chemically improving the adhesion to an insulating layer-forming material after finishing a treatment such as a roughening treatment or a rust-proofing treatment. The silane coupling agent to be used in the silane coupling agent treatment may not be particularly limited and any silane coupling agent, which is selected from an epoxy-functional silane coupling agent, an amino-functional silane coupling agent and a mercapto-functional silane coupling agent, may be used in consideration of the insulating layer-forming material to be used and a plating solution to be used in a printed wiring board manufacturing process. The silane coupling agent layer is formed by using a silane coupling agent solution by a method such as dip-coating, showering coating or electro-deposition.

Re: Embodiment of Manufacturing an Electro-Deposited Copper Foil According to the Present Invention The method for manufacturing an electro-deposited copper foil according to the present invention is a method for manufacturing an electro-deposited copper foil by an electrolytic method using a sulfuric acid base copper electrolytic solution, characterized in that the sulfuric acid base copper electrolytic solution to be used contains additives A to C below. The copper concentration of the sulfuric acid base copper electrolytic solution used herein is 50 g/L to 120 g/L, and more preferably, 50 g/L to 80 g/L. The concentration of free sulfuric acid expected is 60 g/L to 250 g/L, and more preferably, 80 g/L to 150 g/L. Next, additives will be described one by one.

The top concept of the additive A is a compound containing both N and S, preferably a compound composed of a benzene ring and a heterocyclic ring having N and having a mercapto-functional group bonded to the heterocyclic ring. The function of the additive A is to perform high tensile strength in the obtained electro-deposited copper foil. Additive A is likely to distribute uniformly in the crystal grain boundary during electro-deposition to promote excellent miniaturization of deposited copper crystal grains, thereby contributing to stable manufacturing of an electro-deposited copper foil. Thiourea is known to have the equivalent effect as an additive; however, the decomposed compounds of thiourea have a low-molecular weight. Therefore, it is difficult to remove the decomposed compounds. As a result, it is difficult to stabilize the state of thiourea contained in the obtained electro-deposited copper foil and the copper deposition. Then, it is preferred to use an additive primarily having a stable structure such as a benzene ring and a heterocyclic structure containing N because a stable structure which is hardly decomposed in a sulfuric acid base copper electrolytic solution can be formed. In addition, if the mercapto-functional group is bonded to the heterocyclic group and a benzene ring has a sulfo group bonded thereto, the polarity may increase. As a result, the additive can be easily dissolved in an aqueous solution and thus the effect as the additive to be used in a sulfuric acid base copper electrolytic solution and stability thereof can be maintained.

The equivalent effect is performed by some of the thiourea-functional compounds without common structure of the additive A (that is, a structure having a benzene ring and a heterocyclic ring containing N and having a mercapto-functional group bonded to thereto). For example, a thiourea-functional compound with an alkane group having 2 or more carbon atoms at both ends, the polarity of thiourea is reduced by the presence of the alkane group. Accordingly, it may be considered that such a thiourea-functional compound hardly decompose like thiourea during an electrolysis, while maintaining the effect due to the presence of a structure of "=S" with respect to the reactivity with copper ions. Therefore, when such a thiourea-functional compound is used, drawbacks caused when thiourea itself is used, may hardly occur.

Specific examples of the additive A having a benzene ring and a heterocyclic ring containing N and having a mercapto-functional group bonded thereto include an imidazole-functional compound, a thiazole-functional compound and a tetrazole-functional compound, and also include a triazole-functional compound and an oxazole-functional compound. Thiourea based additive A is a thiourea-functional compound having an alkane group with 2 or more carbon atoms. In practice, one, two or more types of compounds selected from the above compounds are preferably used.

Furthermore, it is preferable to use additive A composed of a benzene ring having a sulfo group bonded thereto. The compound having a benzene ring having a sulfo group bonded thereto is extremely stable in a sulfuric acid base copper electrolytic solution. As a result, the electrolysis is stabilized and the life of the solution increases.

Of the imidazoles, thiazoles and tetrazoles having the aforementioned structure and serving as the additive A, the compound having a benzene ring and a heterocyclic group containing N and having a mercapto-functional group bounded thereto is preferably used. Specific examples thereof may include 2-mercapto-5-benzimidazole sulfonic acid (hereinafter, referred to as "2M-5S"), 3(5-mercapto-1H-tetrazolyl)benzene sulfonate (hereinafter, referred to as "MSPMT-C") and 2-mercaptobenzothizole (hereinafter, referred to as "WM"). The structure of 2M-5S is shown in Chemical formula 1, the structure of MSPMT-C in Chemical formula 2, and the structure of WM in Chemical formula 3. In practice, a readily available salt thereof which dissolves in water easily, for example, Na salt as used in Examples (described later) is preferable.

As a thiourea-functional compound with an alkane group having 2 or more carbon atoms bonded at both ends, it is preferred to use N,N-diethylthiourea (hereinafter, referred to as "EUR") which might be stable because of the structure. The structure of EUR is shown in Chemical formula 4 below. Since EUR contains N and S in the equivalent structure as of thiourea, it clearly performs the effect of an additive. In addition, since EUR has an ethyl group at both ends, the activity of the functional group at the terminal is weak. By virtue of this, EUR is sufficiently stable in an electrolytic solution. Note that the additives listed above are the additives whose effect has been confirmed. It should be noted that any compound may be used as long as it is confirmed to have the equivalent structure and effect.

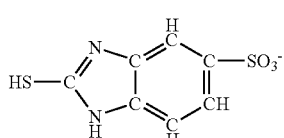

[Chemical formula 1]

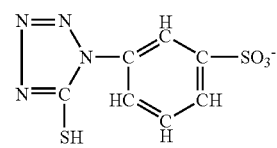

[Chemical formula 2]

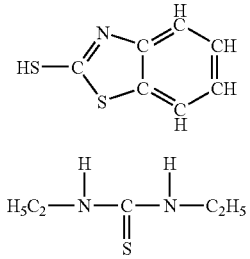

[Chemical formula 3]

[Chemical formula 4]

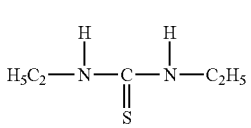

The total concentration of the additives A in a sulfuric acid base copper electrolytic solution is preferably 1 ppm to 50 ppm, and more preferably 3 ppm to 40 ppm. When the total concentration of the additives A in a sulfuric acid base copper electrolytic solution is less than 1 ppm, the amount of additive A incorporated into an electro-deposited copper foil (deposited by electrolysis) is insufficient. In this case, it is difficult to maintain large mechanical strength in the obtained electro-deposited copper foil for a long time. In contrast, when the total concentration of the additives A exceeds 50 ppm, the smoothness of the deposit surface of the electro-deposited copper foil is lost. In this case, the gloss is reduced and it is difficult to obtain large mechanical strength. The content of the additives A in the copper electrolytic solution can be confirmed by using HPLC (high performance liquid chromatography).

Additive B is a sulfonate of an active sulfur compound. The additive B performs to increase the gloss of the surface of the obtained electro-deposited copper foil. As the additive B, it is preferred to use 3-mercapto-1-propanesulfonic acid (hereinafter, referred to as "MPS"), bis(3-sulfopropyl)disulfide (hereinafter, referred to as "SPS") or a mixture thereof. The compound expected that performs the effect of a brightening agent in the electrolytic solution is SPS. However, SPS is generated as a dimer in a sulfuric acid base copper electrolytic solution in which MPS is added. Therefore, it is acceptable to add MPS instead of adding SPS directly. The structure of MPS is shown in Chemical formula 5 and the structure of SPS is in Chemical formula 6 below. From comparison on these structures, it is clearly understand that SPS is a dimer of MPS.

[Chemical formula 5]

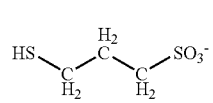

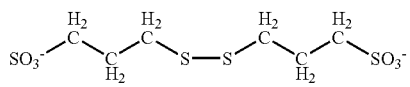
[Chemical formula 6]

The concentration of MPS and/or SPS in a sulfuric acid base copper electrolytic solution is preferably 1 ppm to 80 ppm, more preferably 10 ppm to 70 ppm, and further preferably 10 ppm to 60 ppm. When the concentration is less than 1 ppm, it is difficult to obtain the electro-deposited copper foil with a glossy deposit surface. In this case, it is difficult to stably obtain an electro-deposited copper foil having large mechanical strength. On the other hand, when the concentration exceeds 80 ppm, the copper deposition is likely unstable. In this case, it is difficult to stably obtain an electro-deposited copper foil having large mechanical strength. Note that, to simply calculate the concentration, the concentration of SPS is expressed in terms of equivalent sodium salt of MPS (hereinafter referred to as "MPS-Na"), which is most purchasable in the market at present.

Additive C is a polymer of a quaternary ammonium salt having a cyclic structure. The additive C performs to increase smoothness of the surface of the obtained electro-deposited copper foil. Specifically, as the additive C, a polymer of diallyldimethylammonium chloride (hereinafter referred to as "DDAC") is preferably used. DDAC forms a cyclic structure when it is polymerized. The cyclic structure is partly composed of a nitrogen atom of a quaternary ammonium. The cyclic structures of the DDAC polymer may include a plurality of types such as a 5-membered ring or a 6-membered ring. The cyclic structure of the polymer actually produced varies depending upon the synthesis conditions. The polymer may have either one of them or a mixture of them. Accordingly, of these polymer compounds, a compound having a 5-membered ring and having a chlorine ion as a paired ion is described herein as a representative example in Chemical formula 7 below. As is apparent from Chemical formula 7 below, DDAC has a polymer structure of a dimer or more.

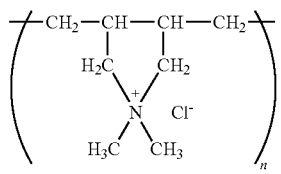
[Chemical formula 7]

The concentration of the DDAC polymer in a sulfuric acid base copper electrolytic solution is preferably 0.5 ppm to 100 ppm, more preferably, 10 ppm to 80 ppm, and further preferably, 20 ppm to 70 ppm. When the concentration of the DDAC polymer in a sulfuric acid base copper electrolytic solution is less than 0.5 ppm, the smoothing effect is not sufficient. No matter how high the concentration of SPS is increased, the deposit surface of the electro-deposited copper foil tends to be rough. In this case, it is difficult to obtain a low-profile surface required for achieving large mechanical strength. On the other hand, when the concentration of the DDAC polymer exceeds 100 ppm, the effect to make the deposit surface of copper smooth does not increase any more but the deposition tends to be unstable. It makes it difficult to obtain large mechanical strength stably.

The ratio of the concentration of the additive B to the concentration of the additive C in the sulfuric acid base copper electrolytic solution, that is, a value of [(B concentration)/(C concentration)], is preferably 0.07 to 1.4. As is described above, the deposition tends to be unstable as the concentrations of both the additive B and the additive C increases. The unstable deposition is observed when the concentration of either one of the components increases. Therefore, the effects of both additives can be stably performed when a value of [(B concentration)/(C concentration)], which is the ratio of the concentration of the additive B to the concentration of the additive C, falls within the range of 0.07 to 1.4. The value of [(B concentration)/(C concentration)] from 0.07 to 1.4 is also preferable for the reasons that the effect of chlorine addition (described later) can be easily performed.

As described above, maintaining of balance among additives A, B and C in a sulfuric acid base copper electrolytic solution is the most important. When the quantitative balance goes to outside of the aforementioned range, the smooth and glossy deposit surface tends to be rough and a low-profile cannot be performed. As a result, it might be difficult to obtain large mechanical strength. Accordingly, an electro-deposited copper foil having extremely large mechanical strength according to the present invention can be stably manufactured by keeping a good balance between them.

The chlorine concentration of the sulfuric acid base copper electrolytic solution containing additives A to C added thereto is preferably 5 ppm to 100 ppm, and more preferably, 20 ppm to 60 ppm. When the chlorine concentration is less than 5 ppm, the mechanical strength of the electro-deposited copper foil tends to be small. On the other hand, when the chlorine concentration exceeds 100 ppm, the electro-deposition of the electro-deposited copper foil tends to be unstable. In this case, it is difficult to obtain large mechanical strength stably. It is preferred to control chlorine concentration by using hydrochloric acid or copper chloride. This is because they never change the nature of the sulfuric acid base copper electrolytic solution.

Re: Embodiment of Copper Clad Laminate and Printed Wiring Board According to the Present Invention The present invention is to provide a copper clad laminate made by bonding a surface-treated electro-deposited copper foil to an insulating layer-forming material. As for the method for manufacturing a copper clad laminate, for a rigid copper clad laminate, a hot press method and a continuous laminate method may be employed. For a flexible copper clad laminate, a conventional technology such as a roll laminate method and a casting method may be employed.

In the case of the rigid copper clad laminate using an insulating layer-forming material containing a reinforcement, the thickness of the copper foil to be used is not particularly limited. Generally, a copper foil having a thickness from about 9 μm to 300 μm is used. In contrast, in the flexible copper clad laminate using an insulating layer-forming material formed of a flexible material having flexibility, a copper foil having a thickness of 8 μm to 20 μm is preferably used since formation of a fine-pitch wiring thereon is generally required.

In the rigid copper clad laminate used as a material for a multilayer printed wring board, the thickness of an insulating layer is required to be thinner. So, it is required that the conductive layer thereof should be thin and low-profile. However, when the thickness of the copper foils used is thinner than 12 μm, the mechanical strength of the laminate is not sufficient, even though the insulating layer is sandwiched by the copper foils. As a result, the laminated board may get crack in handling. However, in the case of a copper clad laminate using an electro-deposited copper foil according to the present invention, the mechanical strength of the copper foil is at least twice as high as that of a conventional electro-deposited copper foil. So, even when a 12 μm-copper foil is bonded thereto, the strength of the obtained substrate is close to the laminated board in which a conventional copper foil of 35 μm is bonded. As a result, handling ability is improved.

In the rigid printed wiring board obtained by using a rigid copper clad laminate according to the present invention as mentioned above, since the electro-deposited copper foil layer thereof has extremely large mechanical strength, defects caused by applying of physical and external force, such as scratch or open circuit may be few. As a result, a high-quality fine-pitch wiring can be obtained. By the way, the copper clad laminate may be processed into a printed wiring board by any one of well-known methods selected from the etching methods such as a subtractive method in which an etching resist is directly formed on the copper foil surface of the copper clad laminate and copper is etched away from an unnecessary portion thereof, and a pattern plating method in which a plating resist for pattern plating is formed, copper is plated on the required portion for wiring including through-holes, and thereafter, copper of unnecessary portion is removed by etching.

The flexible copper clad laminate is used for manufacturing a flexible printed wiring board that is required to have flexibility and light weight. To improve the flexibility and light weight at the same time, the thickness of the insulating layer-forming material has been reduced. As a result, the film strength of the flexible material is also reduced. Therefore, the mechanical strength of a conductor layer formed of an electro-deposited copper foil becomes a factor to determine the flexibility and tensile strength of the flexible copper clad laminate. Hence, the flexible copper clad laminate using an electro-deposited copper foil according to the present invention, since the bonded conductor has extremely large mechanical strength, performs high flexibility and large tensile strength. In addition, since an electro-deposited copper foil according to the present invention has low-profile, it is suitable for forming a fine pattern wiring at the level required for a flexible printed wiring board.

Accordingly, the flexible printed wiring board obtained by using the flexible copper clad laminate according to the present invention has a fine-pitch wiring and suitably used as a wiring board to which relatively large weight is loaded, as mentioned above. More specifically, it is suitable for use in a fine pitch TAB substrate that have never been performed because of bending of a flying lead in an IC chip bonding or elongating of a flying lead by applying of bonding pressure in an IC chip bonding.

As shown above, embodiments have been described. Then, to ease understanding of an electro-deposited copper foil according to the present invention, examples will be described below.

EXAMPLES

Examples 1 to 7

As a basic solution of a sulfuric acid base copper electrolytic solution, a copper sulfate solution prepared to contain copper in a concentration of 80 g/L and free sulfuric acid in a concentration of 140 g/L was used. The concentrations of additives were adjusted as shown in Table 1. The concentrations were arranged by using MPS-Na, DDAC polymer (Unisence FPA100L manufactured by Senka Corporation), one type of compound selected from WM, MSPMT-C, 2M-5S and EUR as additive A and hydrochloric acid were used. More specifically, plurality of electro-deposited copper foils according to Examples 1 to 7 were prepared by using sulfuric acid base electrolytic solutions different in additive contents. The compositions of solutions used in these Examples are shown in Table 1 (described later) together with compositions of solutions used in Comparative Examples.

An electro-deposited copper foil was prepared as follows. The titanium board whose surface was polished with #2000 emery paper for a cathode and the DSA for an anode were used. Electrolysis was performed at a solution temperature of 50° C. and current density of 60 A/dm$^2$ in Example 1. In this way, an electro-deposited copper foil of 15 μm in thickness was prepared. In Examples 2 to 7, electro-deposited copper foils of 12 μm or 15 μm in thickness were prepared by electrolysis at a solution temperature of 50° C. and current density of 51.5 A/dm$^2$. Three electro-deposited copper foils were continuously prepared by electrolysis and the third one was subjected to property evaluation. In the electro-deposited copper foils prepared, the surface roughness (Rzjis) of the shiny surface was 0.84 μm, the surface roughness (Rzjis) of the deposit surfaces was 0.80 μm to 1.71 μm, the gloss [Gs (60°)] was 121 to 530. And the tensile strength as received was 80.8 kgf/mm$^2$ to 97.1 kgf/mm$^2$ and the elongation as received was 4.0% to 6.0%. In addition, the tensile strength after heating of the electro-deposited copper foils was 78.8 kgf/mm$^2$ to 95.7 kgf/mm$^2$, which were reduced to be 89.1% to 98.6% of the tensile strength before heating. An elongation after heating was 3.2% to 4.5%, which were reduced to 58.9% to 85.0% of the elongation before heating. The detailed results of Examples are shown in Table 2 (described later) together with the results of Comparative Examples 1 to 3. Note that the percentage of these values after heating relative to those before heating is expressed as a "retention rate (%)".

COMPARATIVE EXAMPLES

Comparative Example 1

In Comparative Example 1, the same basic solution as in Examples was used. That is, a copper sulfate solution was prepared to contain copper in a concentration of 80 g/L and a free sulfuric acid in a concentration of 140 g/L. The concentrations of the additives were arranged by using MPS-Na, DDAC polymer (Unisence FPA100L manufactured by Senka Corporation) and hydrochloric acid. It means that the same kind of electrolytic solution as in Examples without additive A was used. The composition of the solution was shown in Table 1 (described later) together with a compositions of the solutions used in Examples.

An electro-deposited copper foil was prepared as follows. The titanium board whose surface was polished with #2000 emery paper as a cathode and the DSA as an anode were used. Electrolysis was performed at a solution temperature of 50° C. and current density of 60 A/dm$^2$ to prepare an electro-deposited copper foil of 15 μm in thickness. Three electro-deposited copper foils were continuously prepared by electrolysis in the same manner as in Examples and the third one was subjected to property evaluation. In the electro-deposited copper foil prepared, the surface roughness (Rzjis) of the shiny surface was 0.88 μm, the surface roughness (Rzjis) of the deposit surface was 0.44 μm and the gloss [Gs(60°)] exceeded 600. The tensile strength as received was 35.4 kgf/mm$^2$ and the elongation as received was 14.3%. In addition, in the electro-deposited copper foil, the tensile strength after heating was 30.7 kgf/mm$^2$, which was reduced to be 86.7% of the tensile strength before heating and the elongation after heating was 14.8%, which was gained to be 103.5% of the elongation before heating. The detailed results are shown in Table 2 (described later) together with the results of Examples and Comparative Examples 2 and 3.

Comparative Example 2

In Comparative Example 2, Example 2 disclosed in Patent Document 2 was traced. To describe more specifically, an aqueous sulfuric acid base copper electrolytic solution was prepared to contain a sulfuric acid in a concentration of 100 g/L and a copper sulfate 5 hydrates in a concentration of 280 g/L, and contain additives: hydroxyethylcellulose (80 mg/L), polyethylene imine (30 mg/L), sodium 3-mercapto-1-propanesulfonic acid (170 µmol/L), acetylenic glycol (0.7 mg/L) and chlorine ions (80 mg/L).

An electro-deposited copper foil of 18 µm in thickness was prepared by performing electrolysis using the same apparatus as in Examples at a solution temperature of 40° C. and current density of 40 A/dm$^2$. Three electro-deposited copper foils were continuously prepared by electrolysis and the third one was subjected to property evaluation. A surface roughness (Rzjis) of the shiny surface of the electro-deposited copper foil was 0.84 µm, which is close to the values of Examples. The surface roughness (Rzjis) of the deposit surface was 1.94 µm, the tensile strength as received was 57.7 kgf/mm$^2$ and the elongation as received was 6.8%. The tensile strength after heating of the electro-deposited copper foil was 54.7 kgf/mm$^2$, which was reduced to be 94.8% of the tensile strength before heating. The elongation after heating was 7.3%, which was gained to be 107.4% of the elongation before heating. The detailed results are shown in Table 2 (described later) together with the results of Examples and Comparative Examples 1 and 3.

Comparative Example 3

In Comparative Example 3, Example 3 disclosed in Patent Document 2 was traced. To describe more specifically, an aqueous sulfuric acid base copper electrolytic solution was prepared to contain sulfuric acid in a concentration of 100 g/L and a copper sulfate 5 hydrates in a concentration of 280 g/L, and contain additives: hydroxyethylcellulose (6 mg/L), polyethylene imine (12 mg/L), sodium 3-mercapto-1-propanesulfonic acid (60 µmol/L), acetylenic glycol (0.5 mg/L) and chlorine ions (30 mg/L).

An electro-deposited copper foil of 18 µm in thickness was prepared by performing electrolysis using the same apparatus as in Examples at a solution temperature of 40° C. and current density of 40 A/dm$^2$. Three electro-deposited copper foils were continuously prepared by electrolysis and the third one was subjected to property evaluation. A surface roughness (Rzjis) of the shiny surface of the electro-deposited copper foil was 0.84 µm, which is close to the values of Examples. The surface roughness (Rzjis) of the deposit surface was 1.42 µm, the tensile strength as received was 57.8 kgf/mm$^2$ and the elongation as received was 6.4%. The tensile strength after heating of the electro-deposited copper foil was 55.0 kgf/mm$^2$, which was reduced to be 95.2% of the tensile strength before heating. The elongation after heating was 8.4%, which was gained to be 131.3% of the elongation before heating. The detailed results are shown in Table 2 (described later) together with the results of Examples and Comparative Examples 1 and 2.

TABLE 1

| | Current density (A/dm$^2$) | Basic composition (g/L) Cu | Basic composition (g/L) H$_2$SO$_4$ | Concentrations of the additives (ppm) Cl | MPS | SPS | DDAC polymer | WM | MSPMT-C | 2M-5S | EUR |
|---|---|---|---|---|---|---|---|---|---|---|---|
| Example 1 | 60.0 | 80 | 140 | 30 | 15 | — | 20 | 10 | — | — | — |
| Example 2 | 51.5 | | | 45 | — | 30 | 70 | — | 15 | — | — |
| Example 3 | | | | 45 | — | 30 | 70 | — | 20 | — | — |
| Example 4 | | | | 45 | — | 60 | 70 | — | — | 25 | — |
| Example 5 | | | | 45 | — | 45 | 35 | — | — | 20 | — |
| Example 6 | | | | 45 | — | 60 | 86 | — | — | 35 | — |
| Example 7 | | | | 45 | — | 60 | 70 | — | — | — | 10 |
| Comparative Example 1 | 60.0 | 80 | 40 | 30 | 20 | — | 15 | — | — | — | — |
| Comparative Example 2 | 40.0 | | | Trace experiment of Example 2 of Patent Document 2 | | | | | | | |
| Comparative Example 3 | | | | Trace experiment of Example 3 of Patent Document 2 | | | | | | | |

Symbol of additives

MPS: 3-mercapto-1-propanesulfonic acid

MSPMT-C: 3(5-mercaptor-1H-tetrazolyl)benzene sulfonate

SPS: bis(3-sulfopropyl)disulfide 2M-5S: 2-mercapto-5-benzimidazole sulfonic acid DDAC: diallyldimethylammonium chloride EUR: N,N-diethylthiourea WM: 2-mercaptobenzothiazole

TABLE 2

|  | Thickness of copper foil (μm) | Tensile strength (kgf/mm²) | | | Elongation (%) | | | Surface roughness of deposit | |
|---|---|---|---|---|---|---|---|---|---|
|  |  | As received | After heating | Retention rate (%) | As received | After heating | Retention rate (%) | surface (Rzjis: μm) | Gloss (60°) |
| Example 1 | 15 | 80.8 | 78.8 | 97.5 | 4.5 | 3.3 | 73.3 | 0.88 | 244 |
| Example 2 | 12 | 90.5 | 84.2 | 93.0 | 5.6 | 4.1 | 73.2 | 1.71 | 142 |
| Example 3 | 12 | 91.2 | 83.6 | 91.7 | 6.0 | 3.5 | 58.9 | 1.32 | 197 |
| Example 4 | 12 | 91.3 | 87.6 | 95.9 | 4.0 | 3.4 | 85.0 | 1.46 | 181 |
| Example 5 | 12 | 90.8 | 88.9 | 97.9 | 5.3 | 4.4 | 82.4 | 1.50 | 315 |
| Example 6 | 15 | 97.1 | 95.7 | 98.6 | 5.6 | 4.5 | 80.6 | 0.80 | 530 |
| Example 7 | 12 | 88.4 | 78.8 | 89.1 | 4.4 | 3.2 | 71.5 | 1.49 | 121 |
| Comparative Example 1 | 15 | 35.4 | 30.7 | 86.7 | 14.3 | 14.8 | 103.5 | 0.44 | >600 |
| Comparative Example 2 | 18 | 57.7 | 54.7 | 94.8 | 6.8 | 7.3 | 107.4 | 1.94 | 13 |
| Comparative Example 3 | 18 | 57.8 | 55.0 | 95.2 | 6.4 | 8.4 | 131.3 | 1.42 | 78 |

Comparison between Examples and Comparative Example 1

The difference between Examples and Comparative Examples 1 resides in the presence or absence of additive A as shown in Table 1. More specifically, the composition of the electrolytic solution used in Examples were the composition which contains additive A (WM, MSPMT-C, 2M-5S, EUR) in addition to the composition of the electrolytic solution used in the Comparative Example 1. Accordingly, by virtue of the additive A, the tensile strength as received of the prepared electro-deposited copper foils increase and reduction of the value by heating decrease. In addition, the elongations as received of Examples are smaller than that of the Comparative Example 1. At the same time, in Examples, tendency to reduce an elongation by heating is observed. This may be caused by the quenching recognized as effect of annealing. Therefore, it is clear that the difference between the electro-deposited copper foils prepared in Examples and that prepared in Comparative Example 1 resides in surface roughness, gloss and effect of annealing.

Comparison Between Examples and Comparative Examples 2 and 3

In comparative Examples 2 and 3, manufacturing conditions described in Patent Document 2 were traced. However, as shown in Table 2, tensile strength as received disclosed in Examples of Patent Document 2 was not obtained. It is described in Example 2 of Patent Document 2 that the tensile strength is 890 MPa; however, it was just 565 MPa (the result of Comparative Example 2 was converted in terms of the same unit). Although it is described in Example 3 of Patent Document 2 that the tensile strength is 900 MPa; however, it was just 567 MPa (the result of Comparative Example 3 was converted in terms of the same unit). In addition, in Comparative Examples 2 and 3, elongation is increased by heating. In this respect, the electro-deposited copper foils prepared in these Comparative Examples 2 and 3 show larger tensile strength as received than that prepared in Comparative Example 1; however, they show the same kind of behavior in mechanical strength with that prepared in Comparative Example 1. In other words, when the electro-deposited copper foils of these comparative Examples 2 and 3 are compared to the electro-deposited copper foil according to the present invention, they are equivalent in the roughness of a deposit surface but different in gloss and effect of annealing. Note that the present inventors, who are experts in the field of electro-deposited copper foils, have repeatedly made examinations for several months while managing conditions. In the data obtained through the examinations, the best data are shown in Comparative Examples 2 and 3.

In the Examples above, two types of electro-deposited copper foils different in thickness are prepared. The copper foil as thick as 15 μm is obtained at high-current density electrolytic conditions. Persons skilled in the art recognize that it is rather difficult to manage surface roughness of a thick copper foil manufactured at a high-current density. However, data of a finer surface-roughness are obtained in the case of a 15 μm-copper foil in the above. From this, it is considered that the properties of a 12 μm-copper foil and a 15 μm-copper foil are not substantially affected by the electrolytic conditions. Thus, evaluation data can be directly compared. Furthermore, when an electro-deposited copper foil according to the present invention is manufactured by using a sulfuric acid base copper electrolytic solution containing copper in a concentration of 50 g/L to 120 g/L and a free sulfuric acid in a concentration of about 60 g/L to 250 g/L, good results were obtained. However, in practice, the composition of the electrolytic solution may be modified within a suitable range according to specifications of the equipment. In addition, additive A, MPS and a polymer such as, DDAC described in the aforementioned examples may be added in any method or in any form. Salts with another alkaline metal or alkaline earth metal may be available in place of MPS-Na. If required, an SPS salt is preferably used.

In the sulfuric acid base copper electrolytic solution according to the present invention, the presence of other additives may not be refused. Any additive may be added as long as it extremely increases the effects of the aforementioned additives and as long as it is confirmed to contribute to, for example, stabilizing the quality of products continuously produced. Furthermore, filtration unit for removing contaminants may be installed inside or outside of the process. Additionally, if the influences of decomposed compounds of the additives are concerned, it is effective that adsorption means such as activated carbon may be used.

INDUSTRIAL APPLICABILITY

An electro-deposited copper foil according to the present invention is characterized in that the deposited copper crystal grains are fine and the particle diameters of the grains are distributed within a narrow range that has never been obtained in the art. As a result, the electro-deposited copper foil of the present invention has a glossy deposit surface as well as low-profile, the same level of a conventional low-profile electro-deposited copper foil, and has extremely large mechanical strength in addition. Because of the performance of large mechanical strength, the electro-deposited copper foil of the present invention is suitably used for forming fine-pitch wiring on a tape automated bonding (TAB) substrate. Also, it can be used as a collector of a nonaqueous-electrolyte secondary battery represented by lithium ion battery as described in Patent Document 1. In particular, it can be suitably used as a negative-electrode collector with an active material containing Si and Sn etc., which causes a large volume change during a charge-discharge operation.

The invention claimed is:

1. An electro-deposited copper foil obtained by electrolysis of a copper electrolytic solution, wherein a tensile strength as received (hereinafter referred to as a "tensile strength as received") is 88.4 kgf/mm$^2$ to 100 kgf/mm$^2$,
wherein a tensile strength after heating at 180° C. for 60 minutes (hereinafter referred to as a "tensile strength after heating") is 85% or more of the tensile strength as received.

2. The electro-deposited copper foil according to claim 1, wherein a tensile strength as received measured at 30 days after manufacturing is not less than 65 kgf/mm$^2$.

3. The electro-deposited copper foil according to claim 1, wherein an elongation as received (hereinafter referred to as an "elongation as received") is 3% to 15%.

4. The electro-deposited copper foil according to claim 1, wherein an elongation after heating at 180° C. for 60 minutes (hereinafter referred to as an "elongation after heating") is not more than the elongation as received.

5. The electro-deposited copper foil according to claim 1, wherein a gloss which is measured at a reflection angle of 60° for the transverse direction of a deposit surface (hereinafter referred to as "[Gs(60°)]"), is 80 or more.

6. A surface-treated electro-deposited copper foil characterized in that one, two or more types of treatments selected from a roughening treatment, a rust-proofing treatment and a silane coupling agent treatment are applied to a surface of the electro-deposited copper foil according to claim 1.

7. A method for manufacturing the electro-deposited copper foil according to claim 1 by electrolysis using a sulfuric acid base copper electrolytic solution, characterized in that the sulfuric acid base copper electrolytic solution contains the following additives A to C:
Additive A: a compound composed of a benzene ring and a heterocyclic ring which contains a nitrogen atom (N) and a bonded mercapto-functional group, or a thiourea-functional compound;
Additive B: a sulfonate of an active sulfur compound;
Additive C: a polymer of a quaternary ammonium salt having a cyclic structure.

8. The method for manufacturing an electro-deposited copper foil according to claim 7, wherein the additive A is one, two or more types of compounds selected from an imidazole-functional compound, a thiazole-functional compound, a tetrazole-functional compound and a thiourea-functional compound with an alkane group having 2 or more carbon atoms bonded at both ends.

9. The method for manufacturing an electro-deposited copper foil according to claim 7, wherein the additive A has a benzene ring having a sulfo group bonded thereto.

10. The method for manufacturing an electro-deposited copper foil according to claim 7, wherein the additive A is one, two or more types of compounds selected from 2-mercapto-5-benzimidazole sulfonic acid, 3(5-mercapto-1H-tetrazolyl)benzene sulfonate, 2-mercaptobenzothiazole or N—N diethylthiourea.

11. The method for manufacturing an electro-deposited copper foil according to claim 7, wherein the total concentration of the additive A in the sulfuric acid base copper electrolytic solution is 1 ppm to 50 ppm.

12. The method for manufacturing an electro-deposited copper foil according to claim 7, wherein the additive B is 3-mercapto-1-propanesulfonic acid, bis(3-sulfopropyl)disulfide or a mixture thereof.

13. The method for manufacturing an electro-deposited copper foil according to claim 7, wherein the concentration of the additive B in the sulfuric acid base copper electrolytic solution is 1 ppm to 80 ppm.

14. The method for manufacturing an electro-deposited copper foil according to claim 7, wherein the additive C is a diallyldimethylammonium chloride polymer.

15. The method for manufacturing an electro-deposited copper foil according to claim 7, wherein the concentration of the additive C in the sulfuric acid base copper electrolytic solution is 0.5 ppm to 100 ppm.

16. The method for manufacturing an electro-deposited copper foil according to claim 7, wherein the ratio of the concentration of the additive B to the concentration of the additive C in the sulfuric acid base copper electrolytic solution, that is, a value of [(B concentration)/(C concentration)], is 0.07 to 1.4.

17. The method for manufacturing an electro-deposited copper foil according to claim 6, wherein the concentration of chlorine in the sulfuric acid base copper electrolytic solution is 5 ppm to 100 ppm.

18. A copper clad laminate obtained by bonding the surface-treated electro-deposited copper foil according to claim 6 to an insulating layer-forming material.

19. A rigid copper clad laminate according to claim 18, wherein the insulating layer-forming material contains a reinforcement.

20. A rigid printed wiring board comprising the copper clad laminate according to claim 19.

21. A copper clad laminate according to claim 18, wherein the insulating layer-forming material is formed of a flexible material having flexibility.

22. A flexible printed wiring board comprising the copper clad laminate according to claim 21.

23. An electro-deposited copper foil obtained by electrolysis of a copper electrolytic solution, wherein a tensile strength as received (hereinafter referred to as a "tensile strength as received") is 70 kgf/mm$^2$ to 100 kgf/mm$^2$,
wherein a tensile strength after heating at 180° C. for 60 minutes (hereinafter referred to as a "tensile strength after heating") is 85% or more of the tensile strength as received, and
wherein the copper foil has a surface roughness (Rzjis) at a deposit surface of 0.88 micron-meter or less.

24. A surface-treated electro-deposited copper foil characterized in that one, two or more types of treatments selected from a roughening treatment, a rust-proofing treatment and a silane coupling agent treatment are applied to a surface of the electro-deposited copper foil according to claim 23.

25. A copper clad laminate obtained by bonding the surface-treated electro-deposited copper foil according to claim 24 to an insulating layer-forming material.

26. A copper clad laminate according to claim 25, wherein the insulating layer-forming material contains a reinforcement.

27. A rigid printed wiring board comprising the copper clad laminate according to claim 26.

28. A copper clad laminate according to claim 25, wherein the insulating layer-forming material is formed of a flexible material having flexibility.

29. A flexible printed wiring board comprising the copper clad laminate according to claim 28.

* * * * *